(12) United States Patent
Cramer et al.

(10) Patent No.: US 8,043,965 B2
(45) Date of Patent: Oct. 25, 2011

(54) METHOD OF FORMING A THROUGH SUBSTRATE VIA IN A COMPOUND SEMICONDUCTOR

(75) Inventors: Harlan C. Cramer, Columbia, MD (US); Dale E. Dawson, Linthicum, MD (US)

(73) Assignee: Northrop Grumann Systems Corporation, Los Angeles, CA (US)

( * ) Notice: Subject to any disclaimer, the term of this patent is extended or adjusted under 35 U.S.C. 154(b) by 141 days.

(21) Appl. No.: 12/369,423

(22) Filed: Feb. 11, 2009

(65) Prior Publication Data

US 2010/0203726 A1    Aug. 12, 2010

(51) Int. Cl.
*H01L 21/44* (2006.01)
(52) U.S. Cl. .......... 438/667; 257/E23.011; 257/E21.158
(58) Field of Classification Search .............. 438/667; 257/774, E23.011, E21.158
See application file for complete search history.

(56) References Cited

U.S. PATENT DOCUMENTS

| 5,614,743 | A | * | 3/1997 | Mochizuki | 257/276 |
| 5,949,140 | A | * | 9/1999 | Nishi et al. | 257/728 |
| 7,241,679 | B2 | * | 7/2007 | Kameyama et al. | 438/612 |
| 2009/0072272 | A1 | * | 3/2009 | Suh et al. | 257/194 |
| 2009/0121314 | A1 | * | 5/2009 | Bosholm et al. | 257/529 |

FOREIGN PATENT DOCUMENTS

JP        2005072378 A  *  3/2005

* cited by examiner

*Primary Examiner* — Matthew Smith
*Assistant Examiner* — Christine Enad
(74) *Attorney, Agent, or Firm* — Tarolli, Sundheim, Covelli & Tummino LLP

(57) ABSTRACT

A method is provided for forming a through substrate via in a compound semiconductor having a transistor on a front side of the substrate. The method comprises forming a protective stop pad over a contact area on the front side of the substrate, forming a contact pad overlying the protective stop pad, such that the contact pad is in contact with a terminal of the transistor and plasma etching a backside of the substrate to form a contact coupling via to the protective stop pad. The method further comprises performing a chemical wet etch to remove the protective stop pad and depositing a conductive contact layer in the contact coupling via to provide a conductive contact to the contact pad.

24 Claims, 5 Drawing Sheets

METHOD OF FORMING A THROUGH SUBSTRATE VIA IN A COMPOUND SEMICONDUCTOR

TECHNICAL FIELD

The present invention relates to semiconductors, and more particularly to a method of forming a through substrate via in a compound semiconductor.

BACKGROUND OF THE INVENTION

The method presently used for etching through substrate vias in Gallium Arsenide (GaAs) is to use a chlorine-based plasma that kinetically and chemically attacks the GaAs. A bias voltage directs the plasma ions with some kinetic energy into the hole as it etches at a given etch rate, giving a high aspect ratio (steep sidewall) hole. The chemical reaction helps remove GaAs. The bias voltage, which is across the plasma and not the device can be greater than 100 V at acceptable etch rates. In the case of Indium Arsenide (InAs), this voltage associated with the plasma is enough to exceed the breakdown voltage of the high electron mobility transistor (HEMT), thereby damaging or destroying the device. The standard via etch cannot be used on InAs-channel HEMT MMICs. Furthermore, as etch rates increase the bias voltage can increase resulting in damage to other types of HEMT devices such as Indium Gallium Arsenide (InGaAs) and GaAs based devices.

InAs-channel HEMTs have superior low noise, low power consumption, and high speed due to the "supreme electronic properties of InAs" such as electron mobility and peak velocity. Table I shows 2.5× mobility and 1.5× velocity compared to InGaAs-channel devices, and even greater performance relative to GaAs. The high peak electron velocity at a low electric field enables the operation of InAs HEMTs at very low drain voltage, and therefore at very low power consumption.

TABLE I

HEMT Channel Electronic Material Properties

| Property | InAs | $In_{0.53}Ga_{0.47}As$ | GaAs |
|---|---|---|---|
| Effective Mass | 0.023 | 0.041 | 0.067 |
| Mobility | 20,000 | 8,000 | 4,500 |
| Peak Velocity | 4.0 | 2.7 | 2.2 |
| Valley Separation (eV) | 0.90 | 0.55 | 0.31 |
| Band Gap (eV) | 0.36 | 0.72 | 1.42 |

The high speed, low power consumption advantages are, however, offset by a size disadvantage. The InAs-channel HEMTs presently have to be made in a coplanar transmission line environment, with no through substrate vias. This is because of the low band gap of InAs (last row in Table I). The standard plasma etch via process results in a voltage on the HEMT contact pads that damages the low band gap device. The solution thus far has been to abandon the use of vias and use coplanar transmission lines which are noted for their large ground plane areas on the top surface of the substrate.

SUMMARY OF THE INVENTION

In accordance with one aspect of the present invention, a method is provided for forming a through substrate via in a compound semiconductor having a transistor on a front side of the substrate. The method comprises forming a protective stop pad over a contact area on the front side of the substrate, forming a contact pad overlying the protective stop pad, such that the contact pad is in contact with a terminal of the transistor and plasma etching a backside of the substrate to form a contact coupling via to the protective stop pad. The method further comprises performing a chemical wet etch to remove the protective stop pad and depositing a conductive contact layer in the contact coupling via to provide a conductive contact to the contact pad.

In accordance with another aspect of the present invention, a method is provided for forming a through substrate via in a Gallium Arsenide (GaAs) substrate having a high electron mobility transistor (HEMT) on a front side of the substrate. The method further comprises depositing a dielectric layer over a contact area on the front side of the substrate, chemically wet etching the dielectric layer to form a protective stop pad, forming a contact pad overlying the protective stop pad, such that the contact pad is in contact with a terminal of the HEMT and plasma etching a backside of the substrate to form a contact coupling via to the protective stop pad. The method further comprises performing a chemical wet etch to remove the protective stop pad and depositing a conductive contact layer in the contact coupling via to provide a conductive contact to the contact pad.

In yet another aspect of the invention, a method is provided for forming a through substrate via in a GaAs substrate having an Indium Arsenide (InAs) HEMT on a front side of the substrate. The method comprises depositing a silicon nitride $(Si_3N_4)$, (SiN) layer over a contact area on the front side of the substrate, chemically wet etching the silicon nitride layer to form a protective stop pad, forming a contact pad overlying the protective stop pad, such that the contact pad is in contact with a terminal of the HEMT and plasma etching a backside of the substrate at an etch rate of about 1 to about 10 microns/minute to form a contact coupling via to the protective stop pad. The method further comprises performing a chemical wet etch to remove the protective stop pad and depositing a conductive contact layer in the contact coupling via to provide a conductive contact to the contact pad.

DETAILED DESCRIPTION OF INVENTION

The present invention provides for compound semiconductor through substrate or wafer via etching for backside ground plane connections without damage to low band gap devices. A compound semiconductor alternates between 2 different atomic elements in each layer of the semiconductor structure. During a backside through via etch of a substrate or wafer, voltage builds up inside the backside via that can be transferred to a transistor through a contact pad, both residing on a front side of the substrate or wafer. The voltage can exceed the breakdown voltage of the transistor resulting in damage to the transistor. The present invention replaces coplanar transmission line designs with backside ground plane designs, which results in approximately a 2× size reduction in the devices. The present invention provides for a dielectric layer that resides underneath the transistor contact pad to provide a protective stop pad during backside wafer etching.

The dielectric layer is sufficiently insulating that the contact pad never experiences voltage during the plasma etch. The insulating layer is sufficiently thin that the metal contact pad readily covers the edges of the protective stop pad. After the dry plasma etch of the via, the via can be chemically etched/enlarged to the edge of the protective stop pad. The protective stop pad is then removed by a chemical etch. The chemical etch has no voltage effects on the transistor and therefore the breakdown voltage of the transistor is not exceeded during processing.

Figure 1:
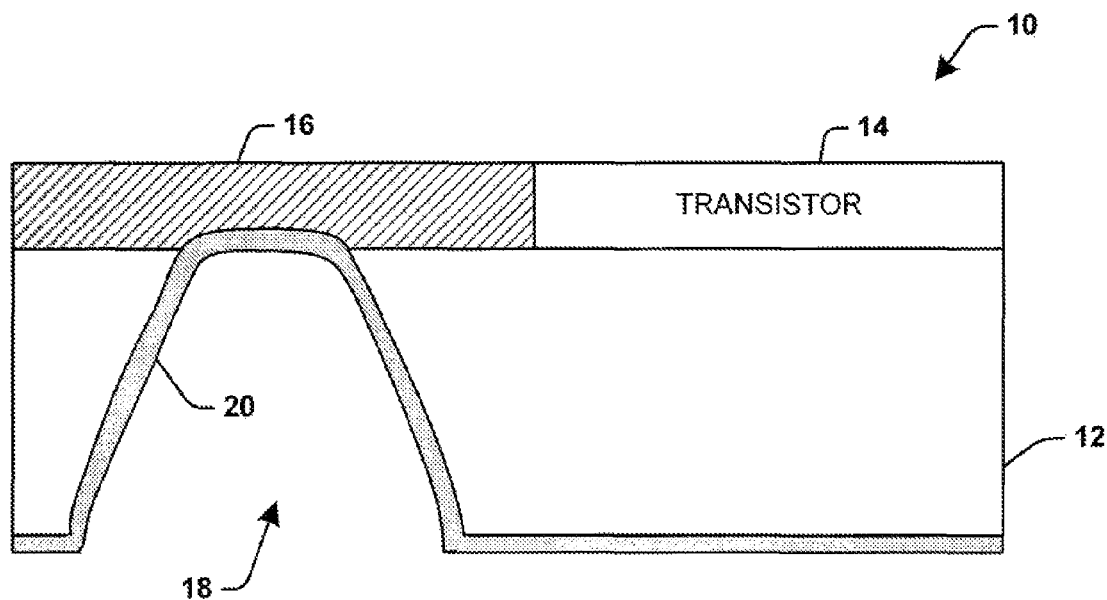
FIG. 1 illustrates a schematic cross-sectional view of a compound semiconductor structure in accordance with an aspect of the present invention.

FIG. 1 is a schematic cross-sectional illustration of compound semiconductor structure 10 in accordance with the present invention. The compound semiconductor structure 10 includes a substrate or wafer 12 comprised of, for example, Gallium Arsenide (GaAs), Indium Phosphide (InP) or other compound semiconductor. The substrate 12 provides mechanical support for the device structure 10, and is of a thickness suitable for providing such support. In one aspect of the invention, the substrate 12 has a thickness of about 100 microns. A transistor 14 and a contact pad 16 adjacent and in contact with the transistor 14 are formed over a front side portion of the substrate 12. The transistor 14 can be, for example, a high electron mobility transistor (HEMT) and the contact pad 16 can be, for example, a source pad coupled to a source of the HEMT, a drain pad coupled to a drain of the HEMT or a gate pad coupled to the gate of the HEMT. The transistor 14 can be formed from Indium Arsenide (InAs), Indium Gallium Arsenide (InGaAs) or GaAs.

A contact coupling via 18 extends from an underside of the substrate 12 to the contact pad 16. The contact coupling via 18 can include a conductive contact layer 20 that extends into a portion of the contact pad 16, along walls of the contact coupling via 18 and along a backside of the substrate 12 to couple one or more transistors together. The conductive contact layer 20 that extends into a portion of the contact pad 16 fills in a portion of the contact pad 16 in which a dielectric layer was removed. The dielectric layer protects the transistor 14 from a breakdown voltage experienced during a via dry plasma etch to form the contact coupling via 18. The conductive contact layer 20 can form a ground layer for grounding a plurality of transistors overlying the substrate 12 and including the transistor 14. The contact pad 16 and the conductive contact layer 20 can be formed from gold, aluminum, copper or other conductive material layer.

Figure 2:
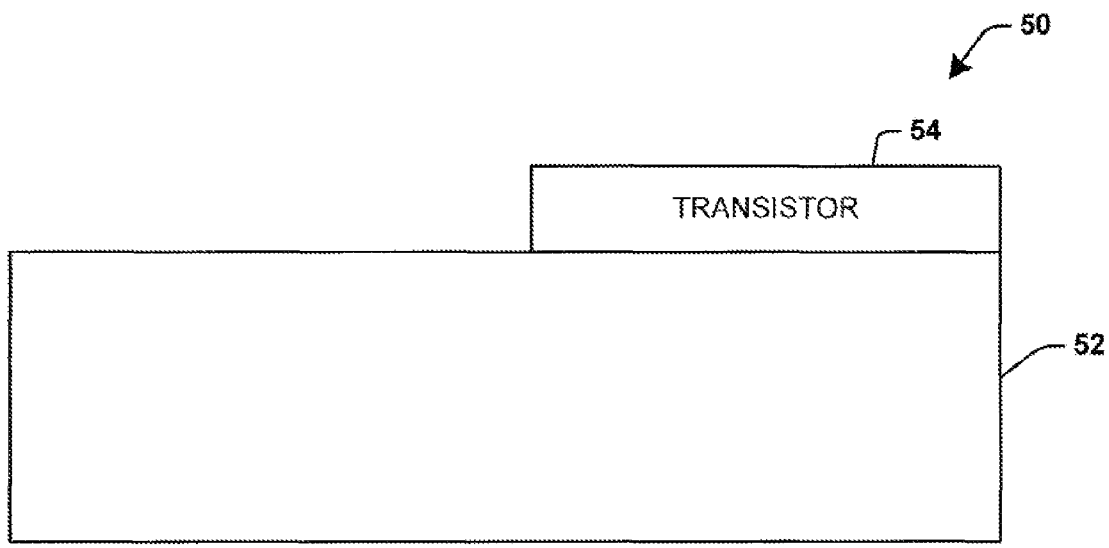
FIG. 2 is a schematic cross-sectional illustration of transistor overlying a compound semiconductor substrate for forming a compound semiconductor structure in accordance with an aspect of the present invention.

Turning now to FIGS. 2-10, process blocks in connection with fabrication of a compound semiconductor structure 50 in accordance with an aspect of the present invention are described. A substrate 52 (e.g., InP substrate, GaAs substrate) or wafer is provided with a transistor 54 disposed over a front side of the substrate 52 as illustrated in FIG. 2. The transistor 54 (e.g., HEMT) can be formed from an InAs material layer, an InGaAs material layer or a GaAs material layer with appropriate doping to form source, drain and gate regions. The transistor layer can be formed by epitaxial growth. It is to be appreciated that any suitable technique for forming the various layers can be employed such as Molecular Beam Epitaxy (MBE), Metal Organic Chemical Vapor Deposition (MOCVD) and Chemical Beam Epitaxy (CBE).

Figure 3:
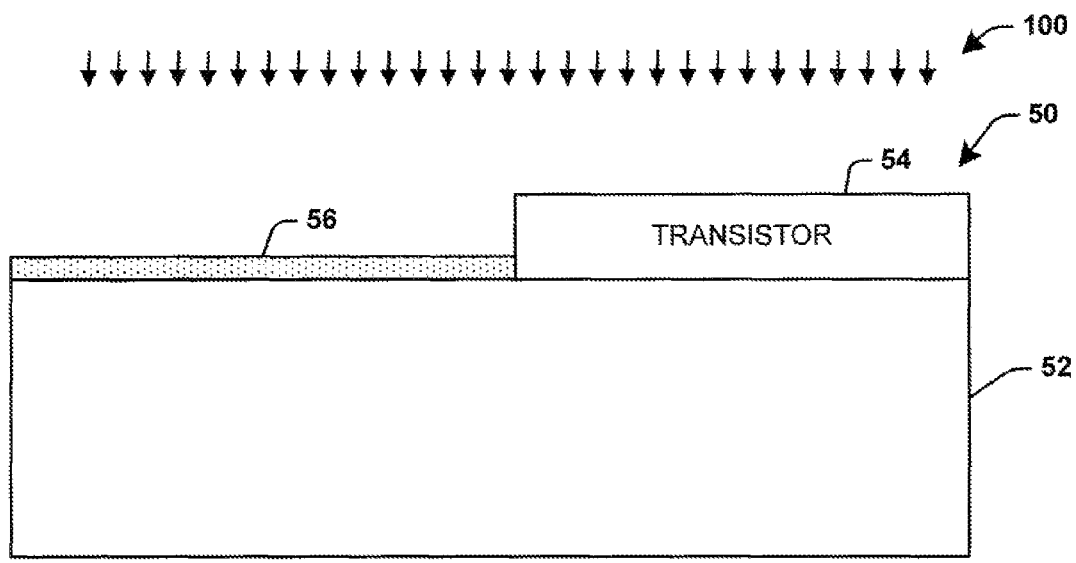
FIG. 3 is a schematic cross-sectional illustration of the structure of FIG. 2 after deposition of a dielectric layer over a contact area and undergoing an etch to form a protective stop pad in accordance with an aspect of the present invention.

Next, a deposition is performed on the structure 50 of FIG. 2. The deposition includes depositing a dielectric layer 56 over a contact area (e.g., silicon nitride ($Si_3N_4$), (SiN), silicon oxynitride ($SiO_xN_y$), silicon dioxide ($SiO_2$) and fluorinated silicon oxide ($SiO_xF_y$), plasma enhanced oxide/nitrides and polyimide(s)). It is to be appreciated that multiple insulating layers of oxides and nitrides can be implemented to carry out the present invention. The dielectric layer 56 provides a protective stop layer for a subsequent dry plasma etch step for forming a contact coupling via to the conductive pad. In one aspect of the invention, the dielectric layer 56 has a thickness of about 1000 Å to about 5000 Å. Any suitable technique for forming the dielectric layer 56 may be employed such as Low Pressure Chemical Vapor Deposition (LPCVD), Plasma Enhanced Chemical Vapor Deposition (PECVD), High Density Plasma Chemical Vapor Deposition (HDPCVD), or sputtering techniques to a thickness suitable for serving as a protective stop pad. However, it is to be appreciated that the thickness of the dielectric layer 56 is dependent on an etch rate of a subsequent contact coupling via etch. The resultant structure is illustrated in FIG. 3.

Figure 4:
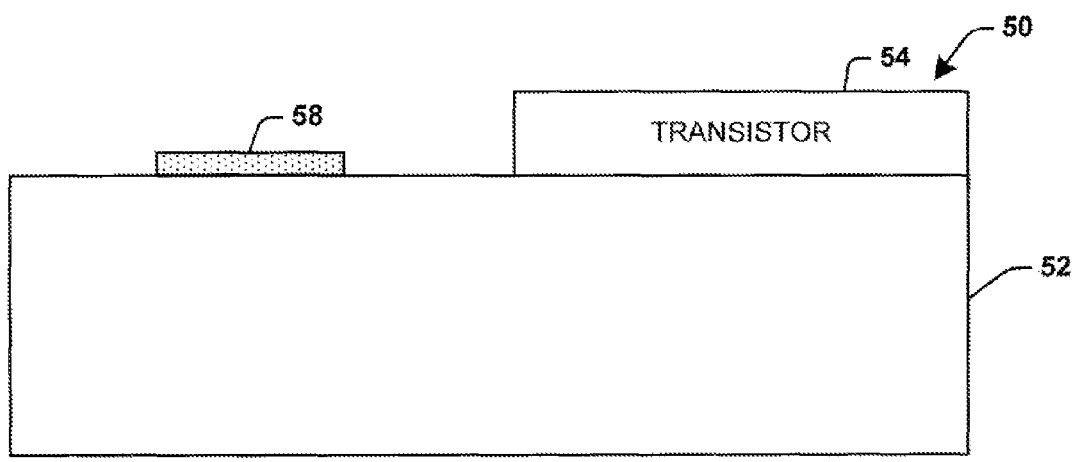
FIG. 4 is a schematic cross-sectional illustration of the structure of FIG. 3 after the etch to form the protective stop pad is substantially complete in accordance with an aspect of the present invention.

An etch 100 (e.g., chemical wet etch) (FIG. 3) is performed to remove portions of the dielectric material layer 56 employing a photoresist or other mask to form a protective stop pad 58 (FIG. 4). Any suitable chemical wet etch material may be used to etch the dielectric material layer 56 based on the type of dielectric material being employed. For example, a nitride dielectric layer can be etched employing a hydrofluoric acid (HF) wet etch.

Figure 5:
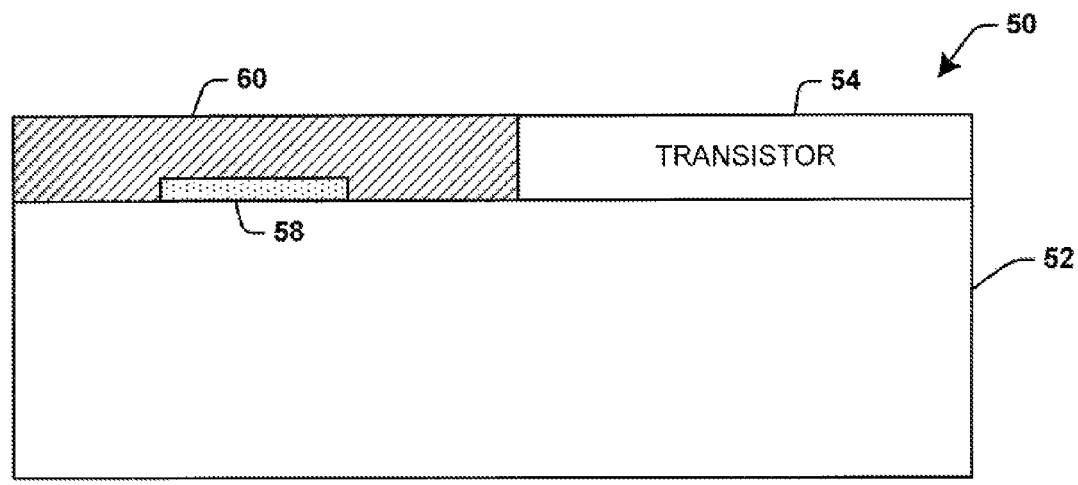
FIG. 5 is a schematic cross-sectional illustration of the structure of FIG. 4 after formation of a contact pad overlying the protective stop pad in accordance with an aspect of the present invention.
Figure 6:
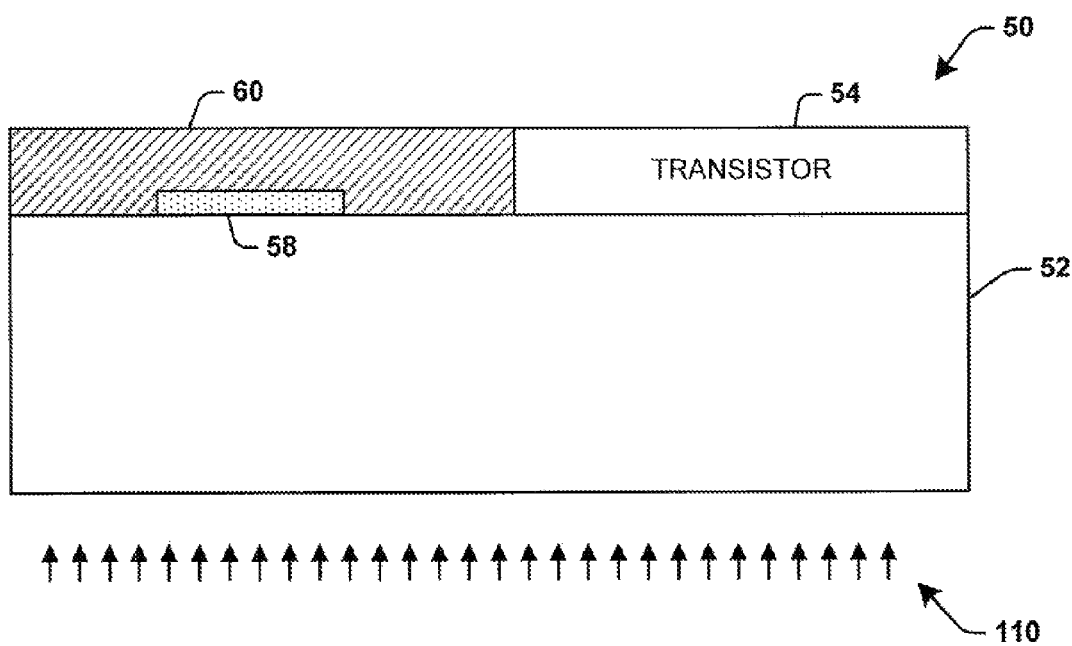
FIG. 6 is a schematic cross-sectional illustration of the structure of FIG. 5 undergoing a backside via etch to form a contact coupling via in accordance with an aspect of the present invention.

Next, a deposition is performed on the structure of FIG. 4. The deposition includes depositing a contact pad layer (e.g., aluminum, titanium, gold, tungsten, platinum, copper) to provide a connection to one of the transistor terminals (e.g., source, gate, drain). A photoresist layer (not shown) is formed on the contact pad layer, patterned by a performing selective irradiation and the irradiated or nonirradiated portions are removed by applying a developer material. Any suitable photolithographic techniques can be performed to form a patterned photoresist material layer. Alternatively, a mask can be formed employing a dielectric hard mask. A contact pad etch is performed to form a contact pad 60 as illustrated in FIG. 5.

Figure 7:
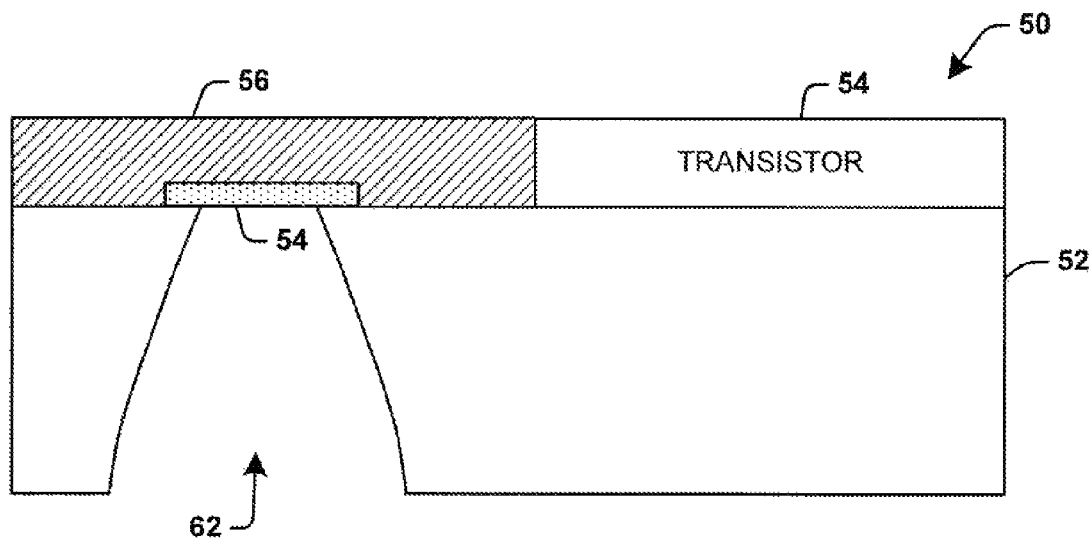
FIG. 7 is a schematic cross-sectional illustration of the structure of FIG. 6 after the backside via etch to form the contact coupling via in accordance with an aspect of the present invention.

A photoresist layer (not shown) is formed on the backside of the substrate 52, patterned by a performing selective irradiation and the irradiated or nonirradiated portions are removed by applying a developer material. A dry plasma etch 110 (FIG. 6) is performed on a backside of the substrate 52 to form a contact coupling 62 via as illustrated in FIG. 7. The dry plasma etch is based on the type of material forming the substrate. For example, a chlorine based plasma etch can be employed for a GaAs substrate. For example, the substrate 52 can be anisotropically etched with a plasma gas(es) containing chlorine ions, in a commercially available etcher, such as a parallel plate Reactive Ion Etch (RIE) apparatus, Inductively Coupled Plasma (ICP) reactor or, alternatively, an electron cyclotron resonance (ECR) plasma reactor to replicate the mask pattern of the patterned photoresist layer to thereby create the contact coupling via 62. Preferably, a selective etch technique is used to etch the material of the substrate 52 at a relatively greater rate as compared to the patterned photoresist and underlying protective stop pad 58. The dry plasma etch 110 can be performed at an etch rate of about 1 to about 10 microns/minute.

It is to be appreciated that the etch rate will be based on the type and thickness of the substrate. As previously discussed the dry plasma etch causes bias voltage to build up in the contact coupling via resulting in the transfer of voltage through the contact pad 56 to the transistor 54, which can exceed the breakdown voltage of the transistor 54 and damage the transistor 54. The protective stop pad 58 prevents the voltage buildup from damaging the transistor.

Figure 8:
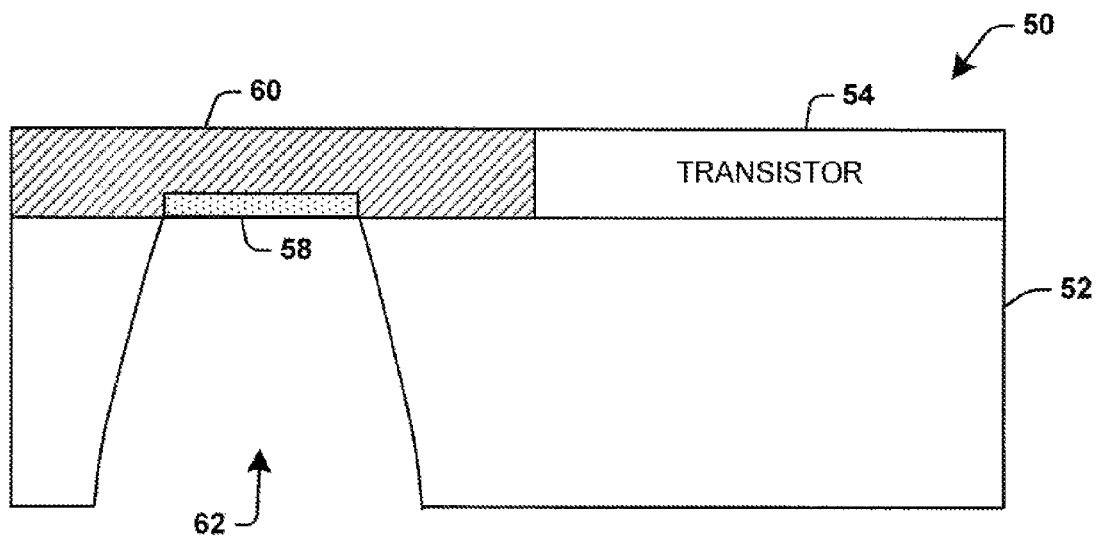
FIG. 8 is a schematic cross-sectional illustration of the structure of FIG. 7 undergoing a backside chemical etch to remove the protective stop pad in accordance with an aspect of the present invention.
Figure 9:
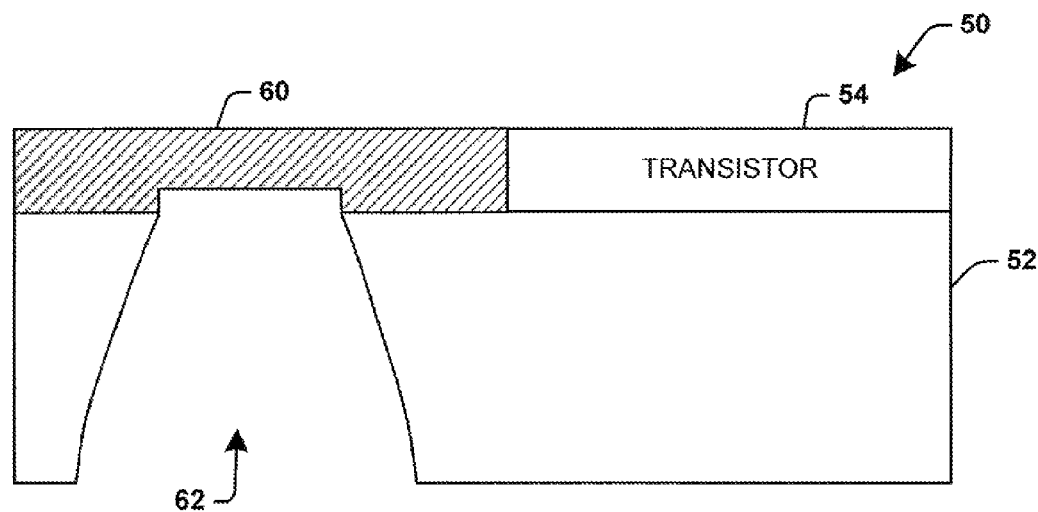
FIG. 9 is a schematic cross-sectional illustration of the structure of FIG. 8 after the backside chemical etch to remove the protective stop pad in accordance with an aspect of the present invention.
Figure 10:
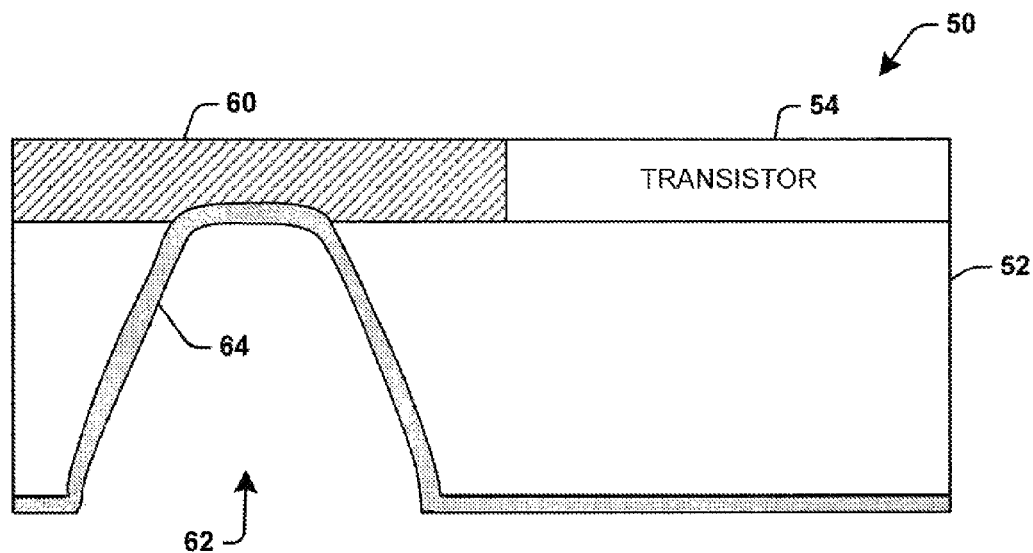
FIG. 10 is a schematic cross-sectional illustration of the structure of FIG. 9 after undergoing a deposition step to form a conductive contact layer in accordance with an aspect of the present invention.

A chemical wet etch 120 is performed to remove the protective stop pad 58. Any suitable chemical wet etch material may be used to etch away the protective stop pad 58 based on the type of dielectric material being employed. For example, a nitride dielectric layer can be etched employing a hydrofluoric acid (HF) wet etch. During the chemical wet etch 120 of the via 62, the via 62 is chemically etched/enlarged to the edge of the protective stop pad 58 as illustrated in FIG. 8. The resultant structure is illustrated in FIG. 9. Next, a deposition is performed on the backside of the structure of FIG. 9. The deposition includes depositing a conductive contact layer 64 (e.g., aluminum, titanium, gold, tungsten, platinum, copper) to provide a connection to the contact pad 60 (e.g., source pad, gate pad, drain pad). The deposition can be performed by employing a sputter tool. The conductive contact layer 64 extends into a portion of the contact pad 60 in which the protective stop pad 58 had been removed and extends along the walls of the contact coupling via 62 and along the underside of the substrate 52 to couple one or more transistors together. The conductive contact layer 64 can form a ground layer for grounding a plurality of transistors overlying the substrate 52 and including the transistor 54.

What has been described above includes exemplary implementations of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications, and variations that fall within the scope of the appended claims.

What is claimed is:

1. A method for forming a through substrate via in a compound semiconductor having a transistor on a front side of the substrate, the method comprising:

forming a protective stop pad over a contact area on the front side of the substrate, wherein the protective stop pad is spaced apart from the transistor;

forming a contact pad overlying the protective stop pad, the contact pad being in contact with a terminal of the transistor;

plasma etching a backside of the substrate to form a contact coupling via to the protective stop pad;

performing a chemical wet etch to remove the protective stop pad; and depositing a conductive contact layer in the contact coupling via to provide a conductive contact to the contact pad.

2. The method of claim 1, wherein the protective stop pad is formed from a dielectric material.

3. The method of claim 2, wherein the dielectric material is one of silicon nitride ($Si_3N_4$), (SiN), silicon oxynitride ($SiO_xN_y$), silicon dioxide ($SiO_2$), fluorinated silicon oxide ($SiO_xF_y$), plasma enhanced oxide/nitrides and polyimide(s).

4. The method of claim of 1, wherein the substrate is formed from one of Gallium Arsenide (GaAs) and Indium Phosphide (InP).

5. The method of claim 4, wherein the transistor is formed from one of Indium Arsenide (InAs), Indium Gallium Arsenide (InGaAs) and Gallium Arsenide (GaAs).

6. The method of claim 1, wherein the depositing a conductive contact layer in the contact coupling via comprises depositing the conductive contact layer into a portion of the contact pad in which the protective stop pad had been removed and also comprises depositing the conductive contact layer along walls of the contact coupling via and along the underside of the substrate to couple one or more transistors together.

7. The method of claim 1, wherein the forming a protective stop pad over a contact area on a front side of the substrate comprises depositing a dielectric layer over the contact area and chemically wet etching the dielectric layer to form the protective stop pad.

8. The method of claim 1, wherein the plasma etching a backside of the substrate to form a contact coupling via to the protective stop pad is performed at an etch rate of about 1 to about 10 microns/minute.

9. The method of claim 8, wherein the substrate has a thickness of about 100 microns.

10. The method of claim 9, wherein the compound semiconductor device is a Indium Arsenide (InAs) high electron mobility transistor (HEMT).

11. The method of claim 1, wherein the contact pad circumscribes the protective stop pad.

12. A method for forming a through substrate via in a Gallium Arsenide (GaAs) substrate having a high electron mobility transistor (HEMT) on a front side of the substrate, the method comprising:

depositing a dielectric layer over a contact area on the front side of the substrate;

chemically wet etching the dielectric layer to form a protective stop pad;

forming a contact pad overlying the protective stop pad, the contact pad being in contact with a terminal of the HEMT;

plasma etching a backside of the substrate to form a contact coupling via to the protective stop pad;

performing a chemical wet etch to remove the protective stop pad; and depositing a conductive contact layer in the contact coupling via to provide a conductive contact to the contact pad.

13. The method of claim 12, wherein the dielectric material is one of silicon nitride ($Si_3N_4$), (SiN), silicon oxynitride ($SiO_xN_y$), silicon dioxide ($SiO_2$), fluorinated silicon oxide ($SiO_xF_y$), plasma enhanced oxide/nitrides and polyimide(s).

14. The method of claim 12, wherein the transistor is formed from one of Indium Arsenide (InAs), Indium Gallium Arsenide (InGaAs) and GaAs.

15. The method of claim 12, wherein the depositing a conductive contact layer in the contact coupling via comprises depositing the conductive contact layer into a portion of the contact pad in which the protective stop pad had been removed and comprises depositing the conductive contact layer along walls of the contact coupling via and along the underside of the substrate to couple one or more transistors together.

16. The method of claim 12, wherein the plasma etching a backside of the substrate to form a contact coupling via to the protective stop pad is performed at an etch rate of about 1 to about 10 microns/minute and wherein the substrate has a thickness of about 100 microns.

17. The method of claim 16, wherein the compound semiconductor device is a Indium Arsenide (InAs) HEMT.

18. A method for forming a through substrate via in a Gallium Arsenide (GaAs) substrate having an Indium Arsenide (InAs) high electron mobility transistor (HEMT) on a front side of the substrate, the method comprising:
    depositing a silicon nitride ($Si_3N_4$), (SiN) layer over a contact area on the front side of the substrate;
    chemically wet etching the silicon nitride layer to form a protective stop pad;
    forming a contact pad overlying the protective stop pad, the contact pad being in contact with a terminal of the HEMT;
    plasma etching a backside of the substrate at an etch rate of about 1 to about 10 microns/minute to form a contact coupling via to the protective stop pad;
    performing a chemical wet etch to remove the protective stop pad; and
    depositing a conductive contact layer in the contact coupling via to provide a conductive contact to the contact pad.

19. The method of claim 18, wherein the depositing a conductive contact layer in the contact coupling via comprises depositing the conductive contact layer into a portion of the contact pad in which the protective stop pad had been removed and comprises depositing the conductive contact layer along walls of the contact coupling via and along the underside of the substrate to couple one or more transistors together.

20. The method of claim 18, wherein the substrate has a thickness of about 100 microns.

21. A method for forming a through substrate via in a compound semiconductor having a transistor on a front side of the substrate, the method comprising:
    forming a protective stop pad over a contact area on the front side of the substrate;
    forming a contact pad overlying the protective stop pad, the contact pad being in contact with a terminal of the transistor;
    plasma etching a backside of the substrate to form a contact coupling via to the protective stop pad, wherein the protective stop pad insulates the transistor from voltage effects during the plasma etching;
    performing a chemical wet etch to remove the protective stop pad; and
    depositing a conductive contact layer in the contact coupling via to provide a conductive contact to the contact pad.

22. The method of claim 21 wherein the chemical wet etch generates a voltage substantially equal to zero.

23. The method of claim 21, wherein the performing of the chemical wet etch removes substantially all of the protective stop pad.

24. The method of claim 21, wherein the performing of the chemical wet etch forms a recess in the contact pad.

* * * * *